(12) United States Patent
Altolaguirre et al.

(10) Patent No.: US 10,177,137 B1
(45) Date of Patent: Jan. 8, 2019

(54) ELECTROSTATIC DISCHARGE PROTECTION APPARATUS

(71) Applicant: MStar Semiconductor, Inc., Hsinchu Hsien (TW)

(72) Inventors: Federico Agustin Altolaguirre, Hsinchu Hsien (TW); Yen-Hung Yeh, Hsinchu Hsien (TW); Po-Ya Lai, Hsinchu Hsien (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 15/891,586

(22) Filed: Feb. 8, 2018

(30) Foreign Application Priority Data

Dec. 27, 2017 (TW) .............................. 106146063 A

(51) Int. Cl.
*H01L 27/02* (2006.01)

(52) U.S. Cl.
CPC ...... *H01L 27/0281* (2013.01); *H01L 27/0255* (2013.01); *H01L 27/0288* (2013.01); *H01L 27/0292* (2013.01)

(58) Field of Classification Search
None
See application file for complete search history.

(56) References Cited

U.S. PATENT DOCUMENTS

| 9,876,003 | B2* | 1/2018 | Chen | H01L 27/0248 |
| 2002/0122280 | A1* | 9/2002 | Ker | H01L 27/0262 361/56 |
| 2007/0230073 | A1* | 10/2007 | Ker | H01L 27/0285 361/56 |
| 2015/0288173 | A1* | 10/2015 | Chen | H01L 27/0248 361/56 |
| 2016/0043542 | A1* | 2/2016 | Peachey | H02H 9/046 361/56 |
| 2017/0069618 | A1* | 3/2017 | Altolaguirre | H01L 27/0262 |

FOREIGN PATENT DOCUMENTS

TW 200820414 A 5/2008

* cited by examiner

*Primary Examiner* — Joseph Schoenholtz
(74) *Attorney, Agent, or Firm* — Edell, Shapiro & Finnan, LLC

(57) ABSTRACT

An electrostatic discharge (ESD) protection apparatus is provided. A first power rail provides first reference voltage. A second power rail provides a second reference voltage. A detection circuit generates a detection result according to whether ESD stress occurs on the first power rail. A first N-type MOSFET has its gate serving as a control terminal. A second N-type MOSFET has its gate serving as a second control node. An intermediate power rail provides an intermediate voltage between the first and the second reference voltages. A first switching circuit couples the first control node to the intermediate power rail or to the first power rail according to the detection result. A second switching circuit couples the second control node to the second power rail or to the first control node according to the detection result.

7 Claims, 5 Drawing Sheets

US 10,177,137 B1

ELECTROSTATIC DISCHARGE PROTECTION APPARATUS

This application claims the benefit of Taiwan application Serial No. 106146063, filed Dec. 27, 2017, the subject matter of which is incorporated herein by reference.

BACKGROUND OF THE INVENTION

Field of the Invention

The invention relates to an electrostatic discharge (ESD) protection apparatus, and more particularly to an ESD protection apparatus capable of preventing time-dependent dielectric breakdown.

Description of the Related Art

To prevent electrostatic discharge (ESD) from causing devastating damages on circuit components, an ESD protection mechanism is commonly provided inside an integrated circuit. For a metal-oxide semiconductor field-effect transistor (MOSFET), a typical ESD protection mechanism uses one single N-type MOSFET (to be referred to as an NMOS transistor) as a clamp circuit between two power rails. In the absence of ESD stress, the NMOS transistor is turned off to prevent unnecessary power consumption or from affecting normal operation of internal circuits. Only when ESD stress occurs on one of the power rails, the NMOS is turned on to conduct the ESD stress to the other of the power rails.

In general, component dimensions in various semiconductor manufacturing processes correspond to the operating voltage. For example, a default operating voltage of a transistor manufactured by a 0.35 µm complementary MOSFET manufacturing process is 3.3 V, whereas a default operating voltage of a transistor manufactured by a 0.18 µm complementary MOSFET manufacturing process is 1.8 V. To be compatible with numerous signal specifications, an input interface of some circuits is designed to be able to receive signals higher than the default operating voltage; for example, a circuit manufactured by a 0.18 µm complementary MOSFET manufacturing process is capable of receiving 3.3 V signals. In the above application, in addition to a power rail supplying a 1.8 V voltage, a power rail supplying a 3.3 V voltage is further provided in the chip. If one single NMOS transistor manufactured by a 0.18 µm complementary MOSFET manufacturing process is placed between a power rail supplying a 3.3 V voltage and a ground line to serve as an ESD clamp circuit, the issue of time-dependent gate oxide breakdown may be resulted. More specifically, for an NMOS transistor manufactured by a 0.18 µm complementary MOSFET manufacturing process, a dielectric layer of the gate of the NMOS transistor can be damaged when the drain and gate of the NMOS transistor withstand a cross voltage of 3.3 V over an extended period of time. Thus, for such type of application, a solution of a clamp circuit formed by cascading two NMOS transistors between two power rails is proposed.

FIG. 1 shows an example of applying a clamp circuit formed by cascaded NMOS transistor as an ESD protection apparatus. A power rail $PR_1$ provides a DC voltage in a value of VDDH. An ESD protection apparatus 100 includes N diodes D connected in series to the power rail $PR_1$ to generate a voltage in a value of (VDDH−N*VD), where VD represents a cross voltage contributed by one diode D. Assuming that the voltage VDDH is 3.3 V, N is equal to 2 and the voltage VD is 0.7 V, (VDDH−N*VD) is 1.9 V. In normal circuit operation, the value of a voltage $V_{G1}$ provided to the gate of a transistor $M_{ESD1}$ is (VDDH−N*VD). From the perspective of direct current, a capacitor C is equivalent to open circuit, no current passes through a resistor R, and the value of a voltage $V_{RC}$ provided to an input end of an inverter 102 is also equal to (VDDH−N*VD), such that the value of a voltage $V_{G2}$ provided to the gate of a transistor $M_{ESD2}$ is equal to a ground voltage VSS provided by a power rail $PR_2$ and the gate is conducted. At this point, the value of a voltage at the drain of the transistor $M_{ESD2}$ is approximately equal to (VDDH−N*VD−$V_{TH}$), where $V_{TH}$ represents a threshold voltage of the transistor $M_{ESD1}$. On the other hand, as shown in FIG. 1, the inverter 102 is coupled between the voltage $V_{G1}$ and the ground voltage VSS, and receives a power supply. In normal circuit operation, the voltage configuration of the ESD protection apparatus 100 prevents the transistors $M_{ESD1}$ and $M_{ESD2}$ in the clamp circuit and the transistors forming the inverter 102 from withstanding the cross voltage having a value of VDDH between the drain and the gate.

When ESD stress occurs on the power rail $PR_1$, cross voltage arises between two ends of the resistor R due to a current passing therethrough, causing the voltage $V_{RC}$ at the input end of the inverter 102 to drop. When the voltage $V_{RC}$ is lower than a state conversion threshold of the inverter 102, the output of the inverter 102, i.e., the value of the voltage $V_{G2}$ provided to the gate of the transistor $M_{ESD2}$, is increased to be equal to the voltage supplied to the inverter 102, i.e., (VDDH−N*VD). In the above situation, the value of the gate voltages of the transistors are both (VDDH−N*VD) and the gates are conducted so as to provide a discharge path between the power rails $PR_1$ and $PR_2$.

As generally known to one person skilled in the art, the values of the discharging current of the transistors $M_{ESD1}$ and $M_{ESD2}$ are positively correlated with the values of the gate voltages thereof. One drawback of the ESD protection apparatus 100 is that, the diodes for reducing voltages and thus protecting the diodes D at the same time form a restriction that limits the gate voltages of the transistors $M_{ESD1}$ and $M_{ESD2}$ to be not higher than (VDDH−N*VD)—the discharge efficiency of such clamp circuit is not ideal.

SUMMARY OF THE INVENTION

The invention is directed to an electrostatic discharge (ESD) protection apparatus for solving the above issues.

According to an embodiment of the present invention, an ESD protection apparatus includes a first power rail, a second power rail, a detection circuit, a first N-type metal-oxide semiconductor field-effect transistor (MOSFET), a second N-type MOSFET, an intermediate power rail, a first switching circuit and a second switching circuit. The first power rail provides a first reference voltage. The second power rail provides a second reference voltage. The detection circuit generates a detection result according to whether ESD stress occurs on the first power rail. The first N-type MOSFET has its drain coupled to the first power rail, its source coupled to a common node, and its gate serving as a first control node. The second N-type MOSFET has its drain coupled to the common node, its source coupled to the second power rail, and its gate serving as a second control node. The intermediate power rail provides an intermediate voltage between the first reference voltage and the second reference voltage. The first switching circuit, coupled between the first power rail and the intermediate power rail, receives a power supply, and determines to couple the first control node to the intermediate power rail or to the first power rail according to the detection result. The second switching circuit, coupled between the first control node and the second control node, receives a power supply, and determines to couple the second control node to the second power rail or to the first control node according to the detection result.

The above and other aspects of the invention will become better understood with regard to the following detailed description of the preferred but non-limiting embodiments. The following description is made with reference to the accompanying drawings.

Figure 1:
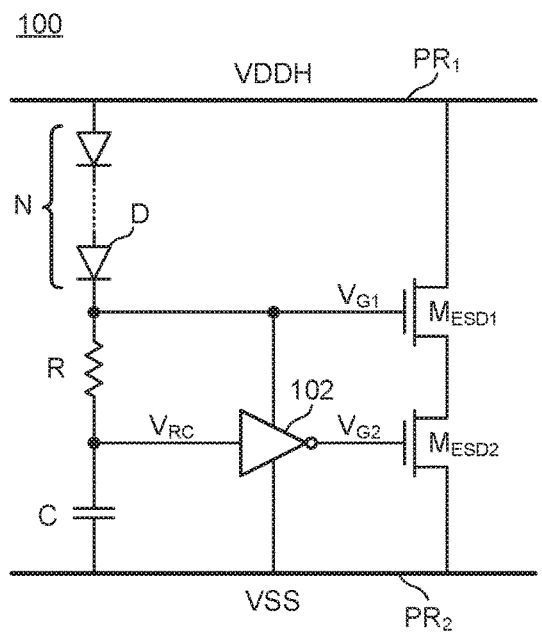
FIG. 1 (prior art) is an example of applying a clamp circuit formed by cascaded NMOS transistor as an ESD protection apparatus.

It should be noted that, the drawings of the present invention include functional block diagrams of multiple functional modules related to one another. These drawings are not detailed circuit diagrams, and connection lines therein are for indicating signal flows only. The interactions between the functional elements/or processes are not necessarily achieved through direct electrical connections. Further, functions of the individual elements are not necessarily distributed as depicted in the drawings, and separate blocks are not necessarily implemented by separate electronic elements.

DETAILED DESCRIPTION OF THE INVENTION

Figure 2:
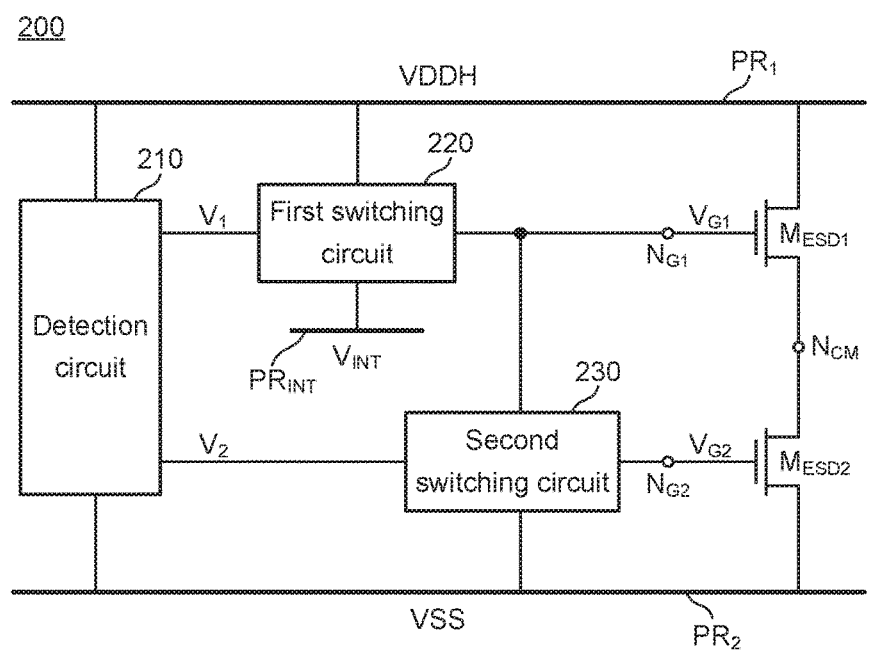
FIG. 2 is a function block diagram of an ESD protection apparatus according to an embodiment of the present invention.

FIG. 2 shows a function block diagram of an electrostatic discharge (ESD) protection apparatus 200 according to an embodiment of the present invention. The ESD protection apparatus 200 includes a first power rail $PR_1$, a second power rail $PR_2$, a detection circuit 210, a first N-type metal-oxide semiconductor field-effect transistor (MOSFET) $M_{ESD1}$, a second N-type MOSFET $M_{ESD2}$, an intermediate power rail $PR_{INT}$, a first switching circuit 220, and a second switching circuit 230. Functions of these circuits are given below.

A circuit in the ESD protection apparatus 200 is coupled between the first power rail $PR_1$ and the second power rail $PR_2$. The first power rail $PR_1$ provides a first reference voltage VDDH, and the second power rail $PR_2$ provides a second reference voltage VSS. In an example where in the ESD protection apparatus 200 a default operating voltage of the components is 1.8 V, the first reference voltage VDDH is another supply voltage higher than 1.8 V (e.g., 3.3 V), and the second reference voltage VSS is a ground voltage.

The transistors $M_{ESD1}$ and $M_{ESD2}$ serving as a clamp circuit are coupled between the first power rail $PR_1$ and the second power rail $PR_2$. The transistor $M_{ESD1}$ has its drain coupled to the first power rail $PR_1$, its source coupled to a common node $N_{CM}$, and its gate serving as a first control node $N_{G1}$. The transistor $M_{ESD2}$ has its drain coupled to the common node $N_{CM}$, its source coupled to the second power rail $PR_2$, and its gate serving as a second control node $N_{G2}$.

The intermediate power rail $PR_{INT}$ provides an intermediate voltage $V_{INT}$ between the first reference voltage VDDH and the second reference voltage VSS. The intermediate voltage $V_{INT}$ may be set as equal to, for example but not limited to, a half of the first reference voltage VDDH, e.g., 1.65 V (=3.3/2). Details for generating the intermediate voltage $V_{INT}$ are to be described shortly.

The detection circuit 210 generates a detection result according to whether ESD stress occurs on the first power rail $PR_1$. In the embodiment in FIG. 2, the detection result includes two voltages, i.e., $V_1$ and $V_2$, which are respectively transmitted to the first switching circuit 220 and the second switching circuit 230.

The first switching circuit 220 is controlled by the voltage $V_1$ to provide the voltage $V_{G1}$ to the first control node $N_{G1}$. As shown in FIG. 2, the first switching circuit 220 is coupled between the first power rail $PR_1$ and the intermediate power rail $PR_{INT}$, and receives a power supply. The first switching circuit 220 allows the first control node $N_{G1}$ to couple to the intermediate power rail $PR_{INT}$ or to the first power rail $PR_1$ according to the voltage $V_1$. The second switching circuit 230 is controlled by the voltage $V_2$ to provide the voltage $V_{G2}$ to the second control node $N_{G2}$. More specifically, the second switching circuit 230 is coupled between the first control node $N_{G1}$ and the second power rail $PR_2$, and receives a power supply. The second switching circuit 230 allows the second control node $N_{G2}$ to couple to the second power rail $PR_2$ or to the first control node $N_{G1}$ according to the voltage $V_2$.

Figure 3:
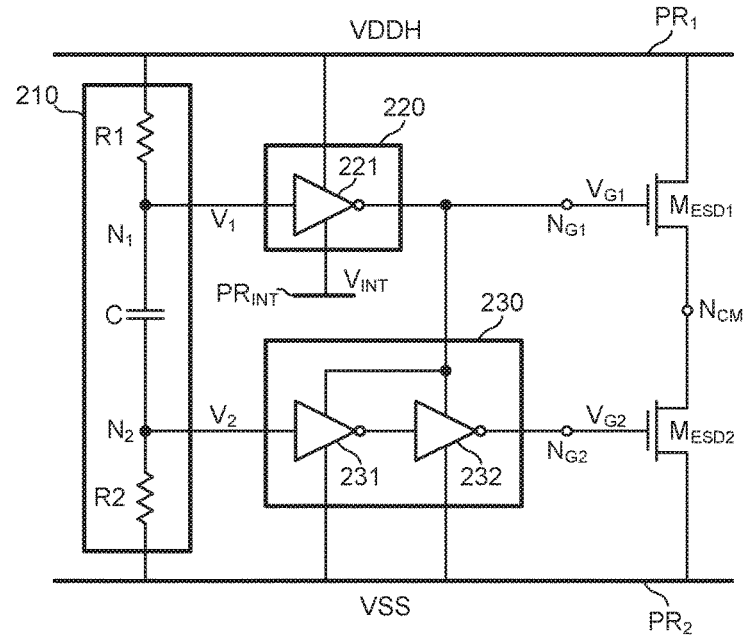
FIG. 3 is a detailed example of an ESD protection apparatus according to an embodiment of the present invention.

FIG. 3 shows a detailed example of the ESD protection apparatus 200 according to an embodiment of the present invention. In this embodiment, the detection circuit 210 includes a first resistor R1, a capacitor C and a second resistor R2 serially connected between the first power rail $PR_1$ and the second power rail $PR_2$. A voltage at a node $N_1$ between the first resistor R1 and the capacitor C is the voltage $V_1$, and a voltage at a node $N_2$ between the capacitor C and the second resistor R2 is the voltage $V_2$. The first switching circuit 220 may be implemented by an inverter 221; the second switching circuit 230 may include two inverters 231 and 232 connected in series.

In the detailed example in the embodiment in FIG. 3, in normal circuit operation, because no current passes through the first resistor $R_1$ and the second resistor $R2$, the voltage $V_1$ is equal to the first reference voltage VDDH, and the second voltage $V_2$ is equal to the second reference voltage VSS. In this situation, the inverter 221 couples the first control node $N_{G1}$ to the intermediate power rail $PR_{INT}$, such that the voltage $V_{G1}$ at the gate of the transistor $M_{ESD1}$ is equal to the intermediate voltage $V_{INT}$. On the other hand, the inverters 231 and 232 couple the second control node $N_{G2}$ to the second power rail $PR_2$, such that the voltage $V_2$ at the gate of the transistor $M_{ESD2}$ is smaller than or equal to the second reference voltage VSS, thus causing the transistor $M_{ESD2}$ stay turned off. At this point, the voltage at the common node $N_{CM}$ is approximately equal to $(V_{INT}-V_{TH})$, where $V_{TH}$ represents a threshold voltage of the transistor $M_{ESD1}$. It should be noted that, the above voltage configuration keeps the transistors $M_{ESD1}$ and $M_{ESD2}$ as well as all of the transistors in the inverters 221, 231 and 232 free from having to withstand a cross voltage in a value of VDDH, between the drain and the gate, over an extended period of time.

When ESD stress occurs on the first power rail $PR_1$, a cross voltage occurs due to a current passing through two ends of the first resistor $R_1$, such that the voltage $V_1$ at the node $N_1$ is relatively lower than the first reference voltage VDDH. The resistance value of the first resistor $R_1$ is designed to cause the voltage $V_1$ to be low enough such that the inverter 221 couples the first control node $N_{G1}$ to the first power rail $PR_1$, further causing the voltage $V_{G1}$ at the gate of the transistor $M_{ESD1}$ to be pulled up to the first reference voltage VDDH. On the other hand, when ESD stress occurs on the first power rail $PR_1$, another cross voltage also occurs due to a current passing through two ends of the second resistor $R_2$, such that the voltage $V_2$ at the node $N_2$ is relatively higher than the second reference voltage VSS. The resistance value of the second resistor $R_2$ may be designed to cause the voltage $V_2$ to drive the inverters 231 and 232 to couple the second control node $N_{G2}$ to the first control node $N_{G1}$. Since the voltage $V_{G1}$ is pulled up to the first reference voltage VDDH by the inverter 221, the voltage $V_{G2}$ is also increased to the first reference voltage VDDH. In this situation, the transistors $M_{ESD1}$ and $M_{ESD2}$ are both in a highly conducted state, thus providing a discharge path. It should be noted that, in response to a need for discharge, the gate voltages $V_{G1}$ and $V_{G2}$ of the transistors $M_{ESD1}$ and $M_{ESD2}$ can both be increased to the first reference voltage VDDH. Compared to the prior at in FIG. 1, the discharging efficiency of this clamp circuit is much more ideal.

It should be noted that, the scope of the present invention is not limited to implementing the function of the detection circuit 210, the first switching circuit 220 or the second switching circuit 230 by a specific circuit. One person skilled in the art could easily conceive that there are numerous other circuit configurations and components capable of realizing the concept of the present invention without departing from the spirit of the present invention.

Figure 4:
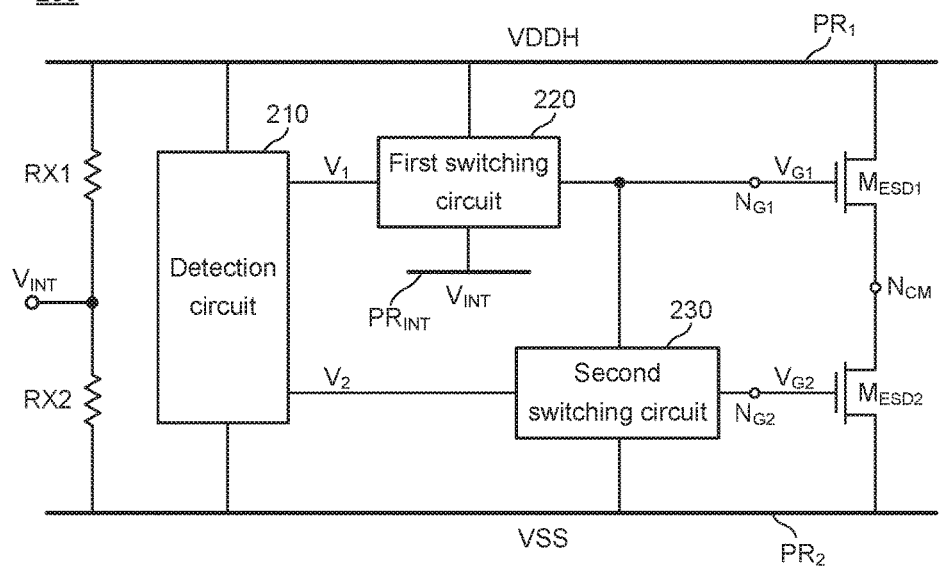
FIG. 4 is an example of a circuit for generating an intermediate voltage.

FIG. 4 shows an example of a circuit for generating the intermediate voltage $V_{INT}$ according to an embodiment. In this embodiment, the ESD protection apparatus 200 further includes two resistors RX1 and RX2 coupled between the first power rail $PR_1$ and the second power rail $PR_2$. A divided voltage caused by the resistors RX1 and RX2 is the intermediate voltage $V_{INT}$ provided to the first switching circuit 220. The value of the intermediate voltage $V_{INT}$ can be determined by selecting a resistance ratio of the resistors RX1 and RX2.

Figure 5A:
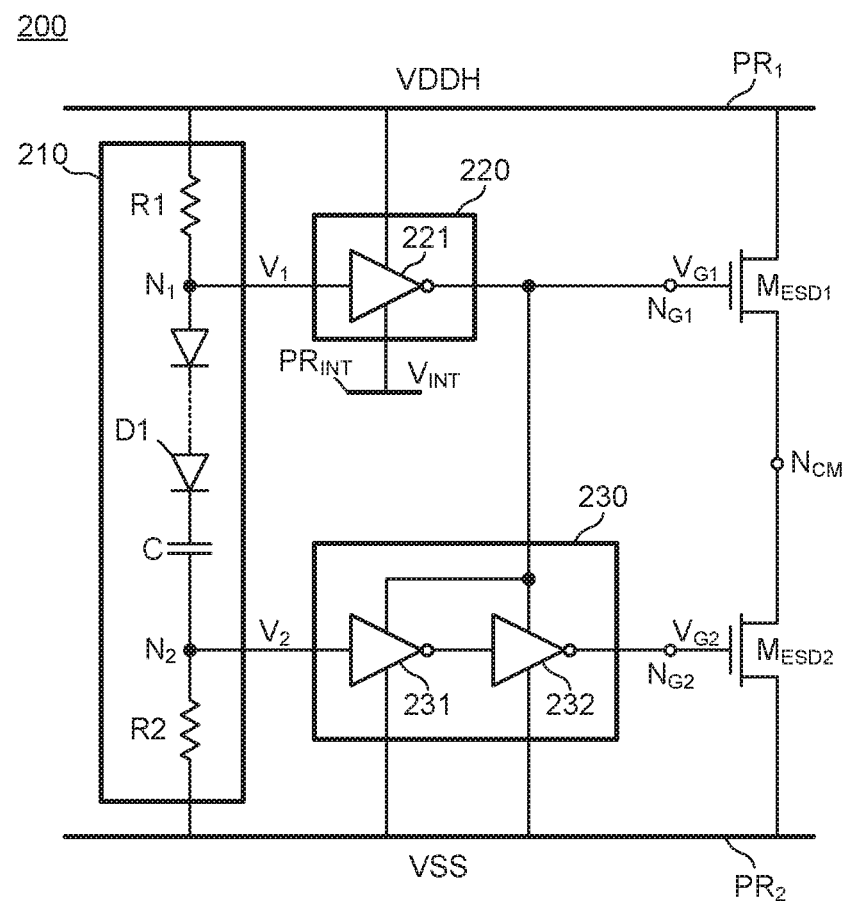
FIG. 5(A) and FIG. 5(B) are variations of a detection circuit according to an embodiment of the present invention.
Figure 5B:
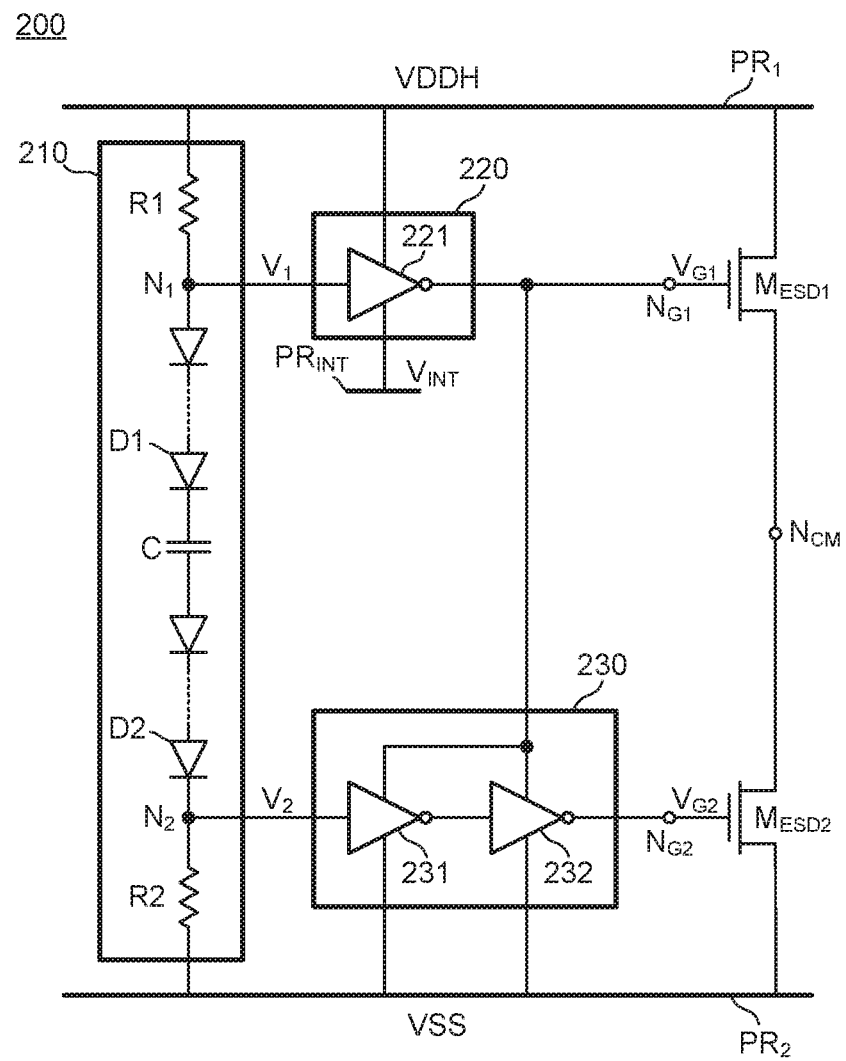

It should be noted that, the term "connected to" or "coupled to" throughout the specification may be a direct connection, or an indirect connection via other intermediate components. For example, as shown in FIG. 5(A), one or more diodes D1 may be further connected in series between the first resistor R1 and the capacitor C in the detection circuit 210, while the operation logic of the detection circuit 210 is kept unchanged. Alternatively, as shown in FIG. 5(B), one or more diodes D2 may be connected in series between the capacitor C and the second resistor R2.

In practice, the capacitor C in the detection circuit 210 may be implemented by a metal layer in a chip or a MOSFET. In the above situation where the detection circuit 210 further includes diodes connected in series therein, the diodes provide protection that frees the transistors forming the capacitor C from withstanding a cross voltage in a value of VDDH over an extended period of time.

Figure 6:
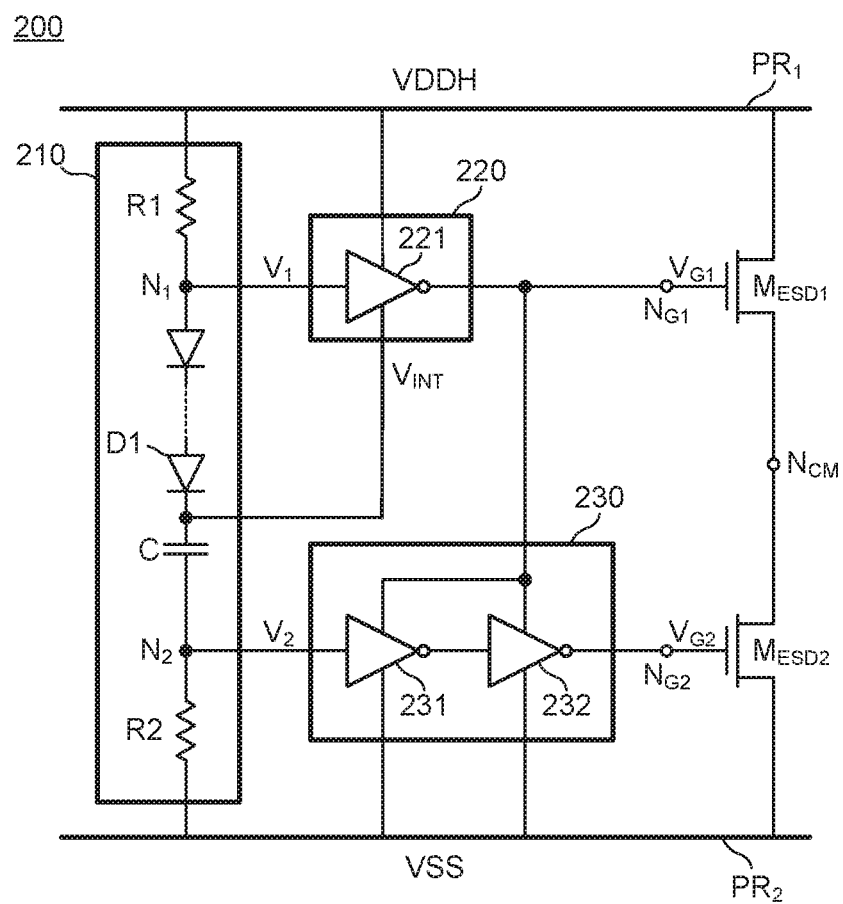
FIG. 6 is another example of a circuit for generating an intermediate voltage.

As shown in FIG. 6, the intermediate voltage $V_{INT}$ may also be generated by an intermediate node connected in series between the diode D1 and the capacitor C in the detection circuit 210. As such, the value of the intermediate voltage $V_{INT}$ may be determined by selecting the number of the diodes D1. The above approach offers an advantage of saving the power consumption constantly passing through the resistors RX1 and RX2.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrostatic discharge (ESD) protection apparatus, comprising:
    a first power rail, providing a first reference voltage;
    a second power rail, providing a second reference voltage;
    a detection circuit, generating a detection result according to whether electrostatic discharge (ESD) stress occurs on the first power rail;
    a first N-type metal-oxide semiconductor field-effect transistor (MOSFET), having a drain thereof coupled to the first power rail, a source thereof coupled to a common node, and a gate thereof serving as a first control node;
    a second N-type MOSFET, having a drain thereof coupled to the common node, a drain thereof coupled to the second power rail, and a gate thereof serving as a second control node;
    an intermediate power rail, providing an intermediate voltage between the first reference voltage and the second reference voltage;
    a first switching circuit, electrically coupled between the first power rail and the intermediate power rail, causing the first control node to be coupled to the intermediate power rail or to the first power rail according to the detection result; and
    a second switching circuit, electrically coupled between the first control node and the second power rail, causing the second control node to be coupled to the second power rail or to the first control node according to the detection result.

2. The ESD protection apparatus according to claim 1, wherein the first switching circuit comprises:
    a first inverter, comprising a power supply end, a ground end, an input end and an output end, the input end thereof receiving the detection result, the output end thereof coupled to the first control node, the power supply end thereof coupled to the first power rail, and the ground end thereof coupled to the intermediate power rail.

3. The ESD protection apparatus according to claim 1, wherein the second switching circuit comprises:
    a second inverter, comprising a power supply end, a ground end, an input end and an output end, the input end thereof receiving the detection result, the power supply end thereof coupled to the first control node, and the ground end thereof coupled to the second power rail; and
    a third inverter, comprising a power supply end, a ground end, an input end and an output end, the input end thereof coupled to the output end of the second inverter, the output end thereof coupled to the second control node, the power supply end thereof coupled to the first control node, and the ground end thereof coupled to the second power rail.

4. The ESD protection apparatus according to claim 1, wherein the detection circuit comprises:
- a first resistor, coupled between the first power rail and a first node;
- a second resistor, coupled between the second power rail and a second node; and
- a capacitor, coupled between the first node and the second node;
- wherein, when ESD stress occurs on the first power rail, the detection circuit detects a first voltage drop between two ends of the first resistor, and detects a second voltage drop between two ends of the second resistor, the detection result comprises the first voltage drop and the second voltage drop, the first voltage drop is provided to the first switching circuit, and the second voltage drop is provided to the second switching circuit.

5. The ESD protection apparatus according to claim 4, wherein the capacitor is implemented by one or more MOSFETs, and the detection circuit further comprises:
- one or more diodes, serially connected between the first node and the capacitor.

6. The ESD protection apparatus according to claim 5, wherein the one or more diodes are coupled to the capacitor via an intermediate node, and the intermediate power rail is branched from the intermediate node to accordingly generate the intermediate voltage.

7. The ESD protection apparatus according to claim 1, further comprising:
- a plurality of resistors, coupled between the first power rail and the second power rail, providing a divided voltage thereof as the intermediate voltage.

* * * * *